United States Patent [19]

Yamada

[11] Patent Number: 5,725,100

[45] Date of Patent: Mar. 10, 1998

[54] SEMICONDUCTOR WAFER CASE

[75] Inventor: Naoki Yamada, Miyazaki, Japan

[73] Assignee: Komatsu Electronic Metals Co., Ltd., Hiratsuka, Japan

[21] Appl. No.: 749,972

[22] Filed: Nov. 14, 1996

[51] Int. Cl.[6] ................................. B65D 85/30
[52] U.S. Cl. ..................... 206/710; 206/453; 206/724
[58] Field of Search ......................... 206/710, 711, 206/712, 454, 455, 456, 722–724, 453; 211/41; 118/500

[56] References Cited

U.S. PATENT DOCUMENTS

| | | | |
|---|---|---|---|
| 3,532,213 | 10/1970 | Schulz | 206/454 |
| 3,615,006 | 10/1971 | Freed | 206/454 |
| 4,653,636 | 3/1987 | Armstrong | 206/711 |
| 4,718,549 | 1/1988 | Rissotti et al. | 206/711 |
| 4,830,182 | 5/1989 | Nakazato et al. | 206/710 |
| 5,184,723 | 2/1993 | Karl et al. | 206/710 |
| 5,370,142 | 12/1994 | Nishi et al. | 206/454 |
| 5,577,616 | 11/1996 | Liang | 206/710 |

FOREIGN PATENT DOCUMENTS 6-204329   7/1994   Japan .

*Primary Examiner*—Paul T. Sewell
*Assistant Examiner*—Luan K. Bui
*Attorney, Agent, or Firm*—Varndell Legal Group

[57] ABSTRACT

A semiconductor wafer case provides high resistance to vibration. The semiconductor wafer can be easily accessed from the case. The semiconductor wafer case includes a case body and a holder in which blade-type presser feet are provided. An end of each of the presser feet has a V-shaped cross-section. Spaces are provided between presser feet (32a, 33a) and presser feet (32b, 33b). Two holders of the same shape are provided at opposite sides of the case body so that the holders can hold the semiconductor wafer horizontally.

2 Claims, 5 Drawing Sheets

SEMICONDUCTOR WAFER CASE

BACKGROUND OF THE INVENTION

1. Field of the Invention

The present invention relates to a case for holding semiconductor wafers, and more specifically, to a wafer case for holding a single semiconductor wafer both sides of which have been mirror polished.

2. Description of Related Art

Referring to FIG. 6, a semiconductor wafer 10 is stored in a conventional wafer case which includes an upper case 52 and a lower case 51. The semiconductor wafer 10 is horizontally placed in the lower case 51. Between the semiconductor wafer 10 and the upper case 52, there is a presser foot 53, which is a bent leaf spring, for fixing the semiconductor wafer 10 steadily, thus preventing the wafer from slipping when the case is transported.

However, when the semiconductor wafer 10 is fixed by the presser foot 53, the contact regions in the semiconductor wafer 10 locally receive stress which may damage the wafer when the case is transported.

Moreover, horizontal movement of the wafer 10 in the wafer case may damage the front or back surfaces of the semiconductor wafer. For high quality wafers, such as double-side mirror polished wafers, this damage is particularly severe.

Japanese Patent Laid-open No. 6-204329, titled "Wafer Case" discloses a solution to these problems. In the laid-open patent application, a wafer case, which can store a chamfered wafer, has a holding portion to hold the wafer by surface-contacting a plurality of the chamfered portion.

However, in the aforementioned wafer case, even though the front and back surfaces of the wafer are not contacted with holding plates 16A and 17A, as shown in FIG. 1 of the laid-open patent application, the holding plates 16A and 17A apply shearing stress to the semiconductor wafer W when cases 12 and 13 vibrate, especially when they vibrate vertically. Therefore, the chamfered surface of the wafer or even the entire wafer may be damaged.

SUMMARY OF THE INVENTION

The present invention therefore provides a semiconductor wafer case in which the wafer is horizontally held, easily removed, and free of damage even when the case vibrates.

In the present invention, the semiconductor wafer can be horizontally stored in the wafer case by at least two holders, each of which has a contact surface having a vertical section substantially in the shape of an inequality sign, and provided at opposite sides in the case.

At least one set of holders at horizontally opposite sides of the wafer case is provided for supporting the rim edge of the semiconductor wafer, so that the wafer can be held steadily even when the case receives a violent horizontal force.

Since the holder has a contact surface with a V-shaped vertical cross section for contacting the semiconductor wafer, shearing stress to the semiconductor wafer can be prevented when the case vibrates vertically, thereby holding the semiconductor wafer equally by each of the contact surfaces of the holders.

The holder of the present invention can be removed freely from the case, thereby facilitating cleaning and replacement. The holder of the present invention has at least two contact portions for contacting the semiconductor wafer, and has spaces between the contact portions for inserting tweezers, etc. when automatic engineering is carried out.

DETAILED DESCRIPTION OF THE INVENTION

Figure 1:
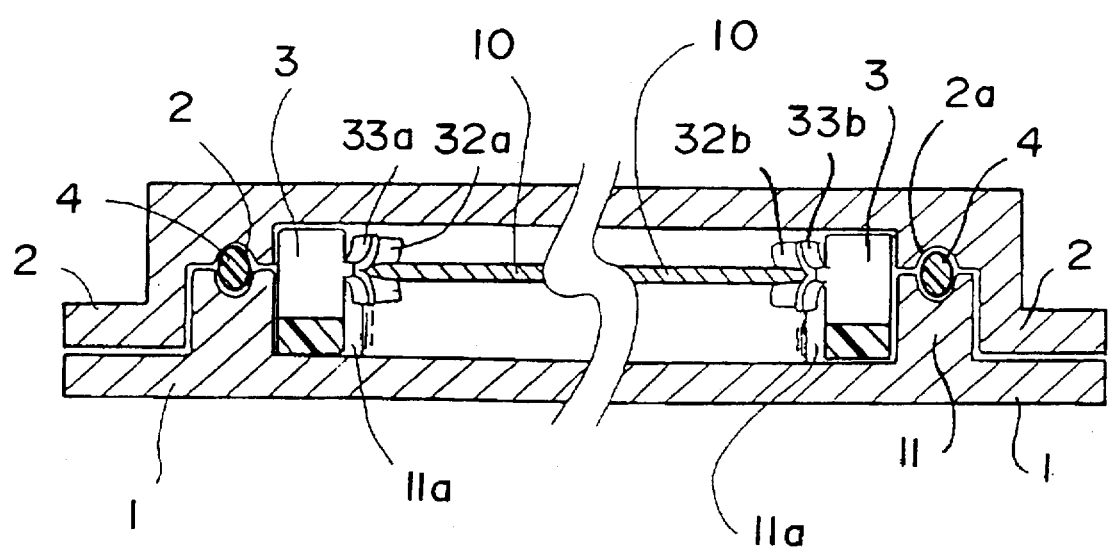
FIG. 1 is a cross-sectional view of a semiconductor wafer case in which a semiconductor wafer is held.

The embodiment of the present invention will be described while referring to the drawings.

Referring to FIG. 1, the semiconductor wafer case of the present embodiment includes a case body 1, a lid 2, a holder 3 and a gasket 4.

Figure 2:
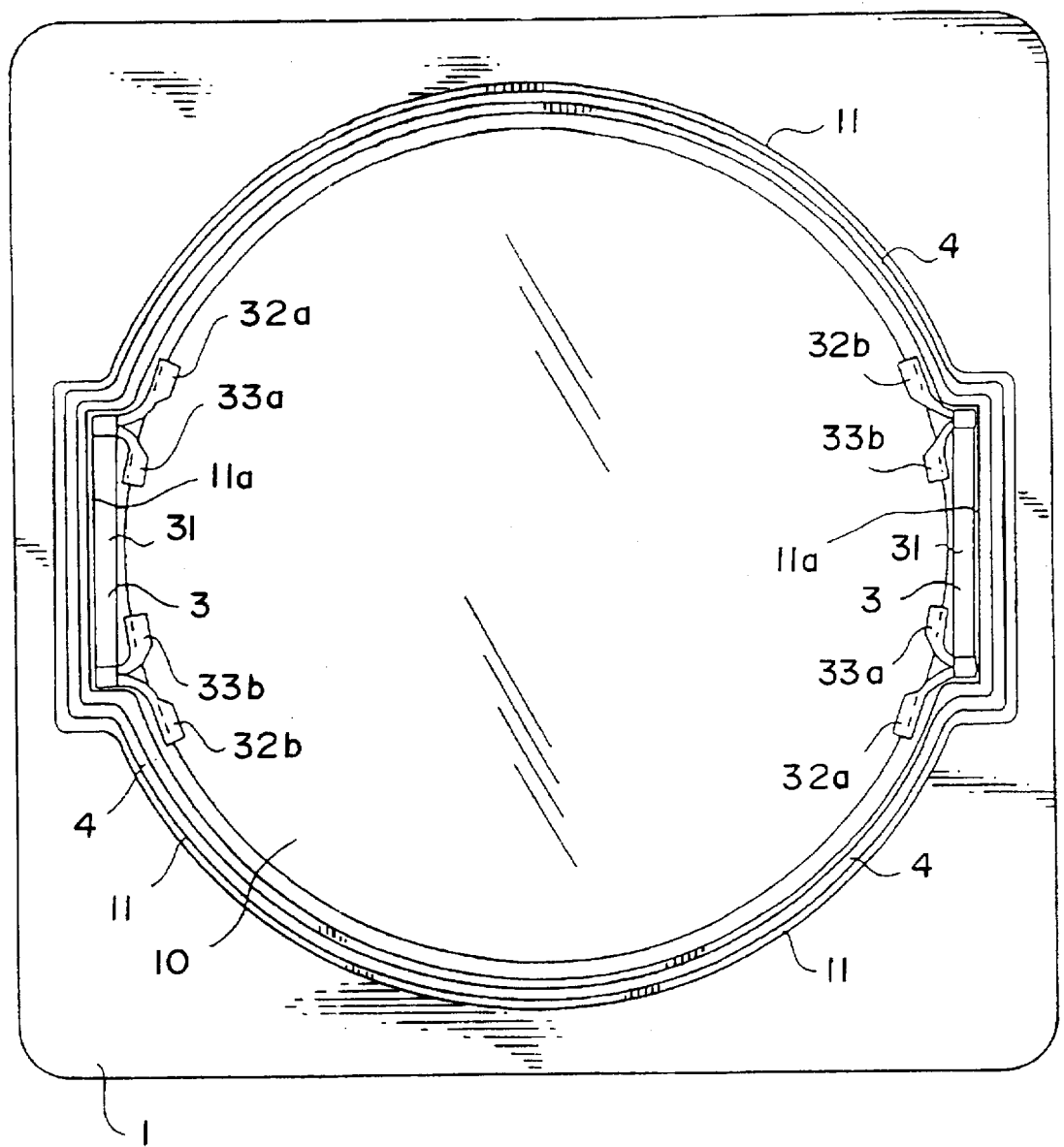
FIG. 2 is a top view of the semiconductor wafer case with a lid being removed.

As shown in FIG. 1 and FIG. 2, in order to engage the lid 2 with the body 1, an extrusive portion 11 of substantially a ring shape is formed on the upper face of the case body 1. The two regions 11a for receiving the holders 3 are formed at opposite sides of the extrusive portion 11.

Figure 3:
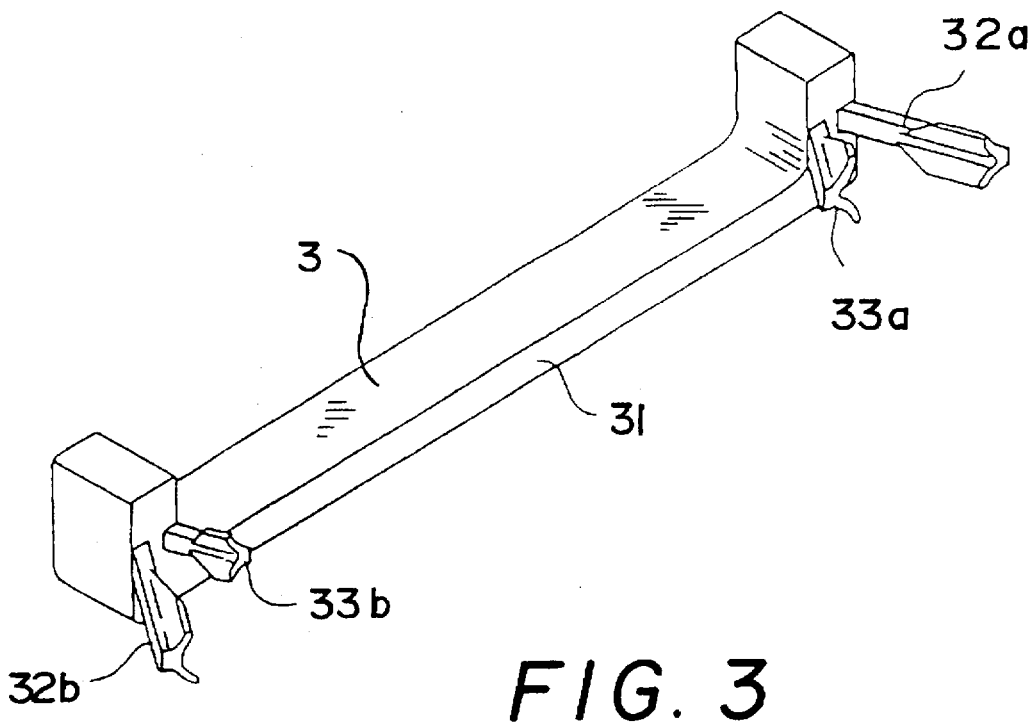
FIG. 3 is a perspective view of a the holder of an embodiment of the present invention.

Referring to FIG. 3, the holder 3 includes a substantially U-shaped support 31, and two sets of blade-type presser feet (32a, 33a and 32b), 33b at two opposite ends of the support 31. Each set of the blade-type presser feet is arranged in a V-shape with the shorter presser feet (33a and 33b) being placed inside. Each presser foot has a V-shaped cross section where opposing sides of the V-shaped contact upper and lower portions of the edge of the single semiconductor wafer.

When the case receives a semiconductor wafer 10, the end portions of the presser feet (32a, 33a, 32b and 33b) are bent as shown in FIG. 2 to support the rim portion of the semiconductor wafer 10. Therefore, the holder 3 is preferably made of elastic materials, such as polypropylene, polyethylene, and polybutylene terephthalate, which do not contaminate the semiconductor wafer.

Since the holder 3 is arranged in the receiving portion 11a of the case, the support 31 should have a length consistent with the receiving portion 11a, so that the holder 3 does not shift away even when the case vibrates. Spaces, in which tweezers can be inserted for accessing the semiconductor wafer during automatic engineering, are formed between the presser feet (32a and 33a), and the presser feet (32b and 33b).

The holder 3 can be freely removed from the case 1, so that it can be entirely cleaned. Since in the wafer case only the holder 3 contacts the semiconductor wafer 10, only the holder 3 has to be replaced when the case deteriorates.

As shown in FIG. 1, the lid 2 covers the top of the case body 1 by engaging the bottom of the lid 2 to the extrusive portion 11 of the case body 1.

Further shown in FIG. 1 and FIG. 2, a gasket 4 is provided, along the extrusive portion 11, over the center region of the extrusive portion 11 of the case body 1. The inner rim of the lid 2 has a groove 2a for engaging the gasket 4. When the semiconductor wafer 10 is stored in the case, and the lid 2 is engaged, the case is totally sealed by the gasket 4, thus preventing contamination to the semiconductor wafer during transportation.

Figure 4:
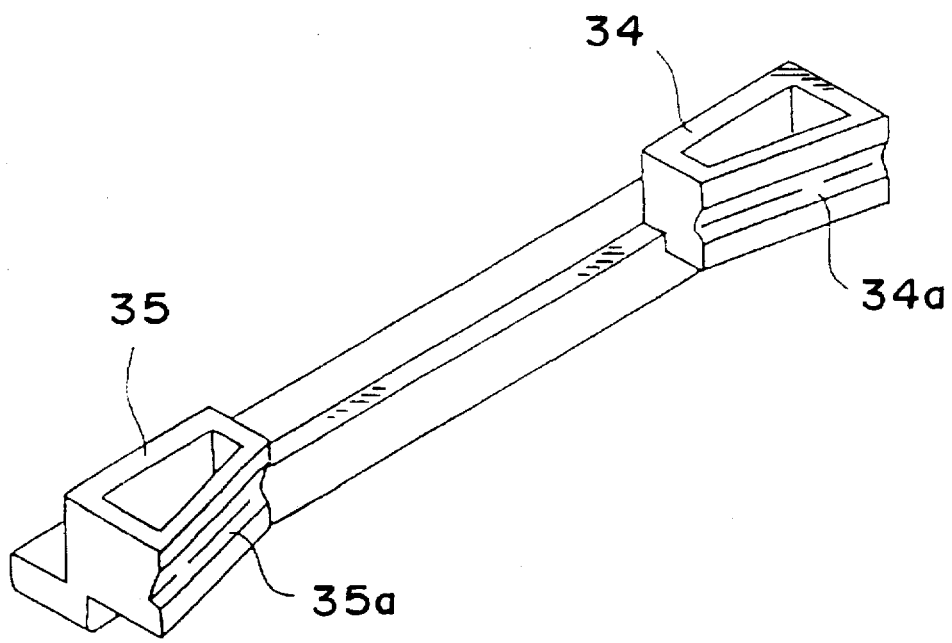
FIG. 4 is a perspective view of a holder of another embodiment of the present invention.

Although in the aforementioned embodiment the inside presser feet 33a and 33b are provided, they can be omitted to leave only the outside presser feet (32a and 32b). Moreover, the presser feet can have other shapes rather than the blade-type. Any other type of presser feet, as far as they can support the semiconductor wafer by contact surfaces having a vertical cross section of substantially V-shape can be utilized in the present invention. For example, referring to FIG. 4, the hollow trapezoidal contact portions 34 and 35 with contact faces 34a, 35a of V-shaped vertical cross section can also be utilized.

Figure 5:
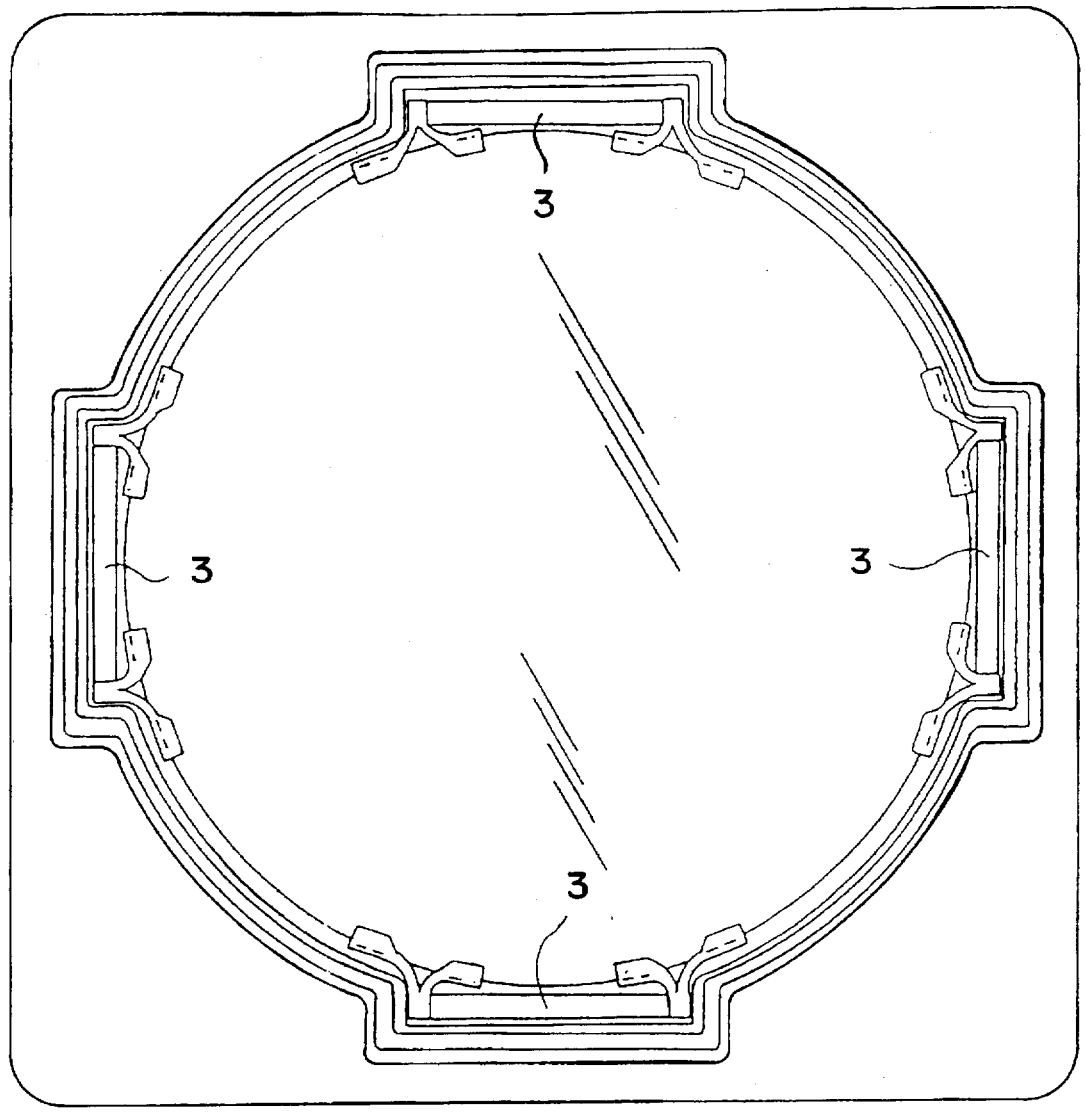
FIG. 5 is a top plan view of a semiconductor wafer case of another embodiment of the present invention.
Figure 6:
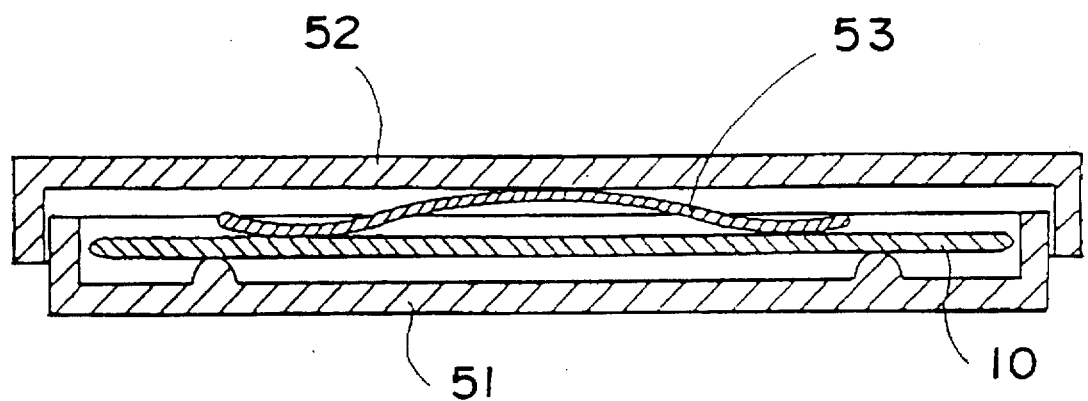
FIG. 6 is a cross-sectional view of a conventional wafer case for accommodating a single wafer.

The embodiment above disclosed has two holders 3 at opposite sides of the case to support the semiconductor wafer. However, the number of holders and their arrangement in the case are not limited. For example, referring to FIG. 5, two sets of holders 3 are arranged at four opposite sides of the case to support the semiconductor wafer 10. Such an arrangement can resist higher external impact to the case.

The aforementioned wafer cases of the present invention have the following advantages.

1. Since the semiconductor wafer is horizontally held, the strongest impulsion in the horizontal direction of the case will not damage the semiconductor wafer.

2. The contact portion has a V-shaped vertical cross-section having a vertical base which support upward and downward the semiconductor wafer in an equilibrium state. Therefore, when the case incurs from a vertical impulse force, no shearing stress will be exerted on the semiconductor wafer.

3. Since the holder holds the semiconductor wafer without contacting the front and back surfaces of the wafer, the surfaces will not be damaged by the holder. Therefore, the wafer case of the present invention is suitable for storing a semiconductor wafer which are mirror polished on both sides.

What is claimed is:

1. A semiconductor wafer case for horizontally storing a single semiconductor wafer, comprising at least two holders arranged at opposite ends of the wafer case and inside the wafer case, each of the holders having first arm with a contact surface for holding an edge of the single semiconductor wafer, the arm extending horizontally from the edge and the contact surface extending horizontally along the edge of the single semiconductor wafer and having a V-shaped cross section where opposing sides of the V-shape contact upper and lower portions of the edge of the single semiconductor wafer, wherein the holders are freely removable from the wafer case.

2. The semiconductor wafer case of claim 1, wherein each of the holders includes a second arm with a second contact surface having a structure mirroring that of the first contact surface, the first and second contact surfaces extending in opposite horizontal directions along the edge of the single semiconductor wafer.

* * * * *